(12) United States Patent
Yin et al.

(10) Patent No.: US 8,399,315 B2
(45) Date of Patent: Mar. 19, 2013

(54) SEMICONDUCTOR STRUCTURE AND METHOD FOR MANUFACTURING THE SAME

(75) Inventors: Haizhou Yin, Poughkeepsie, NY (US); Zhijiong Luo, Poughkeepsie, NY (US); Huilong Zhu, Poughkeepsie, NY (US)

(73) Assignee: Institute of Microelectronics, Chinese Academy of Sciences (CN)

( * ) Notice: Subject to any disclaimer, the term of this patent is extended or adjusted under 35 U.S.C. 154(b) by 0 days.

(21) Appl. No.: 13/062,911

(22) PCT Filed: Sep. 26, 2010

(86) PCT No.: PCT/CN2010/001489
§ 371 (c)(1),
(2), (4) Date: Mar. 8, 2011

(87) PCT Pub. No.: WO2011/147062
PCT Pub. Date: Dec. 1, 2011

(65) Prior Publication Data
US 2011/0291184 A1     Dec. 1, 2011

(30) Foreign Application Priority Data
May 26, 2010   (CN) .......................... 2010 1 0191971

(51) Int. Cl.
*H01L 21/84* (2006.01)
(52) U.S. Cl. .......................... 438/151; 438/270; 438/300
(58) Field of Classification Search .................. 438/151, 438/270, 300
See application file for complete search history.

(56) References Cited

U.S. PATENT DOCUMENTS

| | | | | |
|---|---|---|---|---|
| 6,063,677 A | * | 5/2000 | Rodder et al. | 438/300 |
| 6,225,173 B1 | * | 5/2001 | Yu | 438/301 |
| 6,509,234 B1 | * | 1/2003 | Krivokapic | 438/270 |
| 6,939,751 B2 | * | 9/2005 | Zhu et al. | 438/151 |
| 7,279,430 B2 | | 10/2007 | Chang et al. | |
| 2009/0242973 A1 | | 10/2009 | Hebert et al. | |

(Continued)

FOREIGN PATENT DOCUMENTS

CN      1624885 A      6/2005
CN    101552293 A    10/2009

OTHER PUBLICATIONS

"International Application Serial No. PCT/CN2010/001489, International Search Report mailed Mar. 10, 2011", 5 pgs.

(Continued)

*Primary Examiner* — Long Pham
(74) *Attorney, Agent, or Firm* — Schwegman Lundberg & Woessner, P.A.

(57) ABSTRACT

The present application discloses a semiconductor structure and a method for manufacturing the same. The semiconductor structure comprises a semiconductor substrate; an epitaxial semiconductor layer formed on two side portions of the semiconductor substrate; a gate stack formed at a central position on the semiconductor substrate and abutting the epitaxial semiconductor layer, the gate comprising a gate conductor layer and a gate dielectric layer which is sandwiched between the gate conductor layer and the semiconductor substrate and surrounding the lateral surfaces of the gate conductor layer; and a sidewall spacer formed on the epitaxial semiconductor layer and surrounding the gate. The method for manufacturing the above semiconductor structure comprises forming raised source/drain regions in the epitaxial semiconductor layer utilizing the sacrificial gate. The semiconductor structure and the method for manufacturing the same can simplify the fabrication process for an ultra-thin SOI transistor and reduce the ON-state resistance and power consumption of the transistor.

6 Claims, 7 Drawing Sheets

U.S. PATENT DOCUMENTS

2010/0258869 A1* 10/2010 Morita et al. .................. 257/347
2011/0121363 A1* 5/2011 Cheng et al. .................. 257/190

OTHER PUBLICATIONS

"International Application Serial No. PCT/CN2010/001489, Written Opinion mailed Mar. 10, 2011", 4 pgs.

Cheng, K., et al., "Fully Depleted Extremely Thin SOI Technology Fabricated by a Novel Integration Scheme Featuring Implant-Free, Zero-Silicon-Loss, and Faceted Raised Source/Drain", *2009 Symposium on VLSI Technology Digest of Technical Papers*, (2009), 212-213.

* cited by examiner

SEMICONDUCTOR STRUCTURE AND METHOD FOR MANUFACTURING THE SAME

RELATED APPLICATIONS

This application is a nationalization under 35 U.S.C. 371 of PCT/CN2010/001489, filed Sep. 26, 2010 and published as WO2011/147062 on Dec. 1, 2011, which claimed priority under 35 U.S.C. 119 to Chinese Patent Application Serial No. 201010191971.0, filed May 26, 2010; which applications and publication are incorporated herein by reference in their entirety.

FIELD OF INVENTION

The invention relates to a semiconductor structure and a method for manufacturing the same, and in particular, to an ultra-thin SOI transistor including a channel region formed in a semiconductor substrate and raised source/drain regions (RSDs) above the semiconductor substrate and a method for manufacturing the same.

BACKGROUND

There is a continuous trend of scaling transistor sizes in the development of integrated circuit technology, which, however, brings on the well known short channel effects. In recent years, an ultra-thin SOI transistor is proposed, which has a fully-depleted channel region in a top semiconductor layer of an ultra-thin SOI substrate and short channel effects in the transistor are suppressed well.

As an example, Cheng et al. proposed an ultra-thin SOI transistor structure in "Fully Depleted Extremely Thin SOI Technology Fabricated by a Novel Integration Scheme Featuring Implant-Free, Zero-Silicon-Loss, and Faceted Raised Source/Drain", 2009 Symposium on VLSI Technology Digest of Technical Papers, p 212-213.

As shown in FIG. 1, a conventional ultra-thin SOI transistor is formed on an SOI substrate including a base substrate 11, a buried oxide layer (BOX) 12, and a top semiconductor layer 13. The transistor comprises a channel region formed in the top semiconductor layer, a gate stack including a gate dielectric 14 and a gate conductor 15 formed above the channel region, a sidewall spacer 16 surrounding the gate, and RSDs 17a, 17b.

In such an ultra-thin SOI transistor, the RSDs can reduce the resistance of source/drain region and minimize parasitic capacitances of gate-source and gate-drain. Moreover, when silicides are formed at the top of the source/drain regions, the RSDs ensure that a sufficient amount of Si is involved in the silicidation and avoid Si in the source/drain regions from being exhausted in the silicidation.

However, the formation of RSDs needs to pre-clean the top semiconductor layer of the ultra-thin SOI substrate and epitaxially grow a silicon layer thereon after formation of the gate and sidewall spacers surrounding the gate. This increases the fabrication complexity. Moreover, the portion of the top semiconductor layer of the ultra-thin SOI substrate below the sidewall spacer has a high resistance and causes a very high ON-state resistance since this portion is a part of the source-drain conductive path.

SUMMARY OF THE INVENTION

One object of the present invention is to provide a semiconductor structure easy to be manufactured and having a reduced ON-state resistance, and a method for manufacturing the same.

According to one aspect of the present invention, there provides a semiconductor structure, comprising a semiconductor substrate; an epitaxial semiconductor layer formed on two side portions of the semiconductor substrate; a gate formed at a central position on the semiconductor substrate and abutting the epitaxial semiconductor layer, the gate comprising a gate conductor layer and a gate dielectric layer which is sandwiched between the gate conductor layer and the semiconductor substrate and surrounding the lateral surfaces of the gate conductor layer; and a sidewall spacer formed on the epitaxial semiconductor layer and surrounding the gate.

According to another aspect of the present invention, there provides a method for manufacturing a semiconductor structure, comprising steps of: a) forming an epitaxial semiconductor layer on a semiconductor substrate; b) forming a sacrificial gate on the epitaxial semiconductor layer; c) forming a sidewall spacer surrounding the sacrificial gate; d) removing the sacrificial gate to form a gate gap, so as to expose a surface of the epitaxial semiconductor layer; e) removing the portion of the epitaxial semiconductor layer that is exposed from the gate gap; f) forming a conformal gate dielectric layer in the gate gap; and g) forming a gate conductor layer in the gate gap.

In a semiconductor structure and a method according to the present invention, an epitaxial semiconductor layer is firstly formed and then RSDs are formed in the epitaxial semiconductor layer by taking advantage of a sacrificial gate. Since the above process avoids pre-cleaning or epitaxial growth after the patterning step, it simplifies the fabrication process and improves the yield.

Moreover, in a semiconductor structure according to the present invention, since the RSDs extend below the sidewall spacer and abut the channel region, the resistance of this portion is reduced and thus the resultant transistor has a reduced ON-state resistance and a reduced power consumption.

DETAILED DESCRIPTION OF PREFERRED EMBODIMENTS

Figure 1:
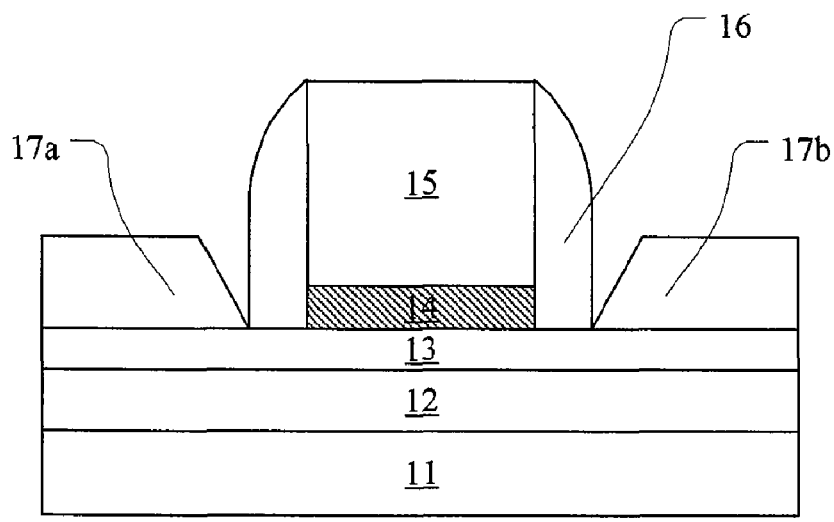
FIG. 1 schematically shows a cross-sectional view of a prior-art ultra-thin SOI transistor.

Exemplary embodiments of the present invention are described in more details below with reference to the accompanying drawings. In the drawings, like reference numerals denote like members. The figures are not drawn to scale, for the sake of clarity.

It should be understood that when one layer or region is referred to as being "above" or "on" another layer or region in the description of the device structure, it can be directly above or on the other layer or region, or other layers or regions may be intervened therebetween. Moreover, if the device in the figures is turned over, the layer or region will be "under" or "below" the other layer or region.

In contrast, when one layer is referred to as being "directly on" or "on and adjacent to" another layer or region, there are not intervening layers or regions present.

Some particular details of the invention will be described, such as an exemplary structure, material, dimension, process step, and fabricating method of the device, for a better understanding of the present invention. Nevertheless, it is understood by one skilled person in the art that these details are not always essential but can be changed in a specific implementation of the invention.

Unless the context clearly indicates, otherwise, each part of the semiconductor device can be made of material(s) known to one skilled person in the art.

According to one preferable embodiment according to the present invention, the steps shown in FIGS. 2 to 14 are performed in sequence for manufacturing the ultra-thin SOI transistor.

Figure 2:
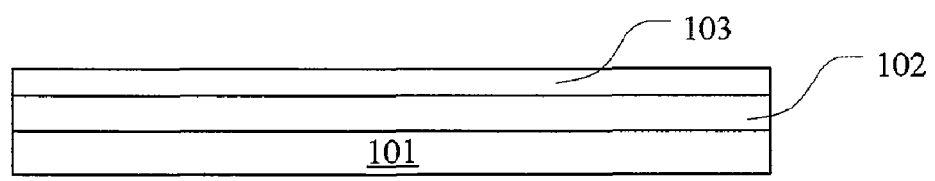
FIGS. 2-14 schematically show cross-sectional views of the semiconductor structure is at various stages of a manufacturing method according to the present invention.

As shown in FIG. 2, the manufacturing process starts with a semiconductor substrate. The semiconductor substrate can be a normal one such as a group-IV semiconductor (for example, Si or Ge) or a group III-V semiconductor (for example, gallium arsenide). Preferably, the semiconductor substrate can be an SOI (semiconductor-on-insulator) wafer comprising a base substrate 101, a buried oxide layer 102, and a top semiconductor layer 103, as used in the prior-art semiconductor structure shown in FIG. 1. More preferably, the substrate is an ultra-thin SOI substrate, in which the top semiconductor layer 103 typically has a thickness no more than 15 nm, preferably no more than 10 nm.

The preparation of an ultra-thin SOI substrate is well known in the art. For example, it may involve layer transfer technologies including wafer bonding. Optionally, if a normal SOI substrate is used, the top semiconductor layer of the normal SOI substrate may be thinned to a desired thickness.

Figure 3:
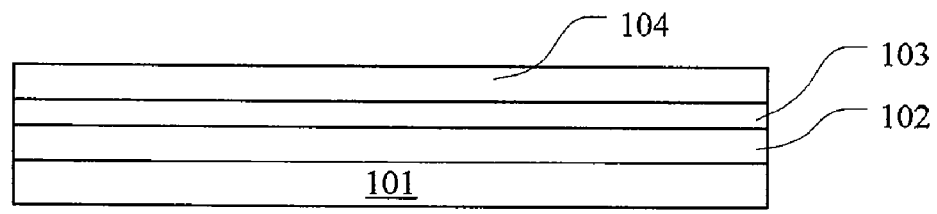

As shown in FIG. 3, an epitaxial semiconductor layer 104 for forming RSDs in subsequent steps is then grown on the top semiconductor layer 103 of the ultra-thin SOI substrate by a conventional deposition process such as CVD. Typically, the epitaxial semiconductor layer 104 has a thickness of about 10-30 nm.

For purposes of simplicity, the deposition processes used here will be not described in detail hereinafter, unless the context clearly indicates otherwise.

Preferably, the epitaxial semiconductor layer 104 and the top semiconductor layer 103 of the ultra-thin SOI substrate are made of materials having different etching rates to provide selectivity in the subsequent etching steps. For example, the top semiconductor layer 103 of the ultra-thin SOI substrate is made of silicon, and the epitaxial semiconductor layer 104 is made of SiGe.

Figure 4:
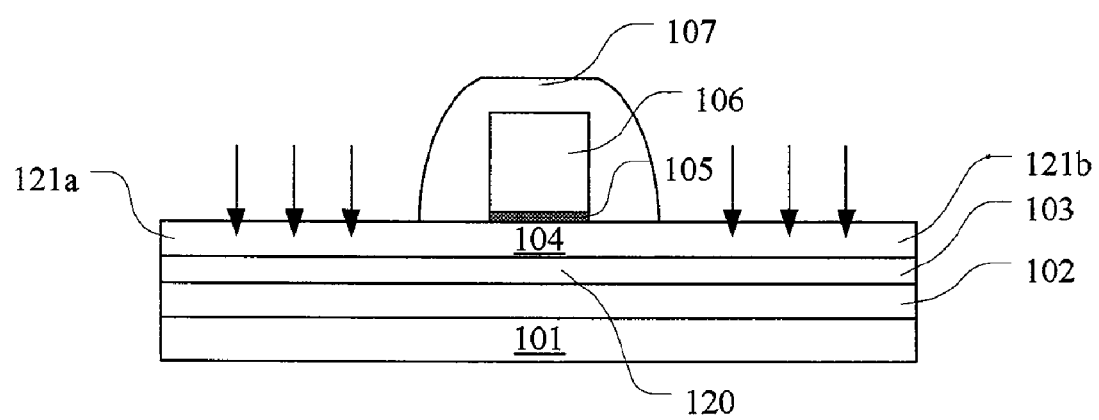

As shown in FIG. 4, a gate comprising a gate dielectric layer 105 and a gate conductor layer 106 are formed on the epitaxial semiconductor layer 104 by a conventional deposition process. As will be described hereinafter, the gate serves as a sacrificial gate (also referred to as "dummy gate"), not a part of the final transistor.

For example, the process of forming a sacrificial gate may comprise depositing a gate dielectric layer and a gate conductor layer in sequence and then patterning the two layers.

The patterning process may involve the following steps: a patterned photoresist mask is formed on the gate conductor layer by a lithographic process including steps of exposure and development; the exposed portions of the gate conductor layer and the gate dielectric layer are removed by dry etching, such as ion beam milling, plasma etching, reactive ion etching, laser ablation and so on, or wet etching using a solution of etchant, the etching process stopping on the top of the epitaxial semiconductor layer; and the photoresist mask is then removed by ashing or dissolution with a solvent.

For simplicity, the patterning processes used here will be not described in detail hereinafter, unless the context clearly indicates otherwise.

An insulating layer is then deposited on the whole surface of the semiconductor structure. The insulating layer is patterned to provide a nitride isolation layer 107 (for example, $Si_3N_4$) on the top and lateral sides of the gate.

The portion of the nitride isolation layer 107 on the top of the gate provides a cap serving as an etch stopper layer and a protective layer in the subsequent planarization process.

Next, optionally, as in a conventional MOS process, ions are implanted into the exposed portions of the epitaxial semiconductor layer 104 with the sacrificial gate as a hard mask to provide doped regions, so as to form source/drain regions 121a, 121b.

Figure 14:
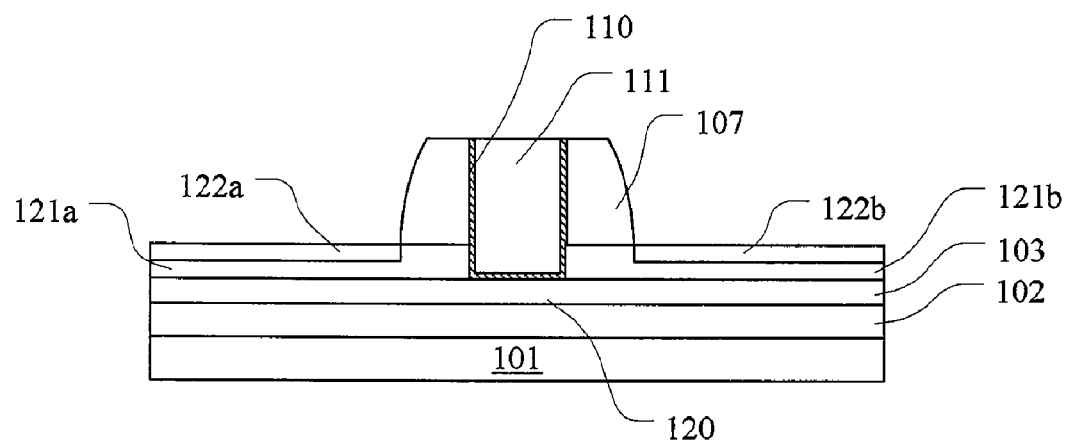

Alternatively, the epitaxial semiconductor layer 104 may be doped in situ when it is formed in the step shown in FIG. 3. Consequently, as will be described hereinafter, the remaining portions 121a, 121b of the epitaxial semiconductor layer in the final transistor as shown in FIG. 14 serve as source/drain regions.

At the same time, the portion of the top semiconductor layer 103 of the ultra-thin SOI substrate below the sacrificial gate will provide a channel region 120.

Figure 5:
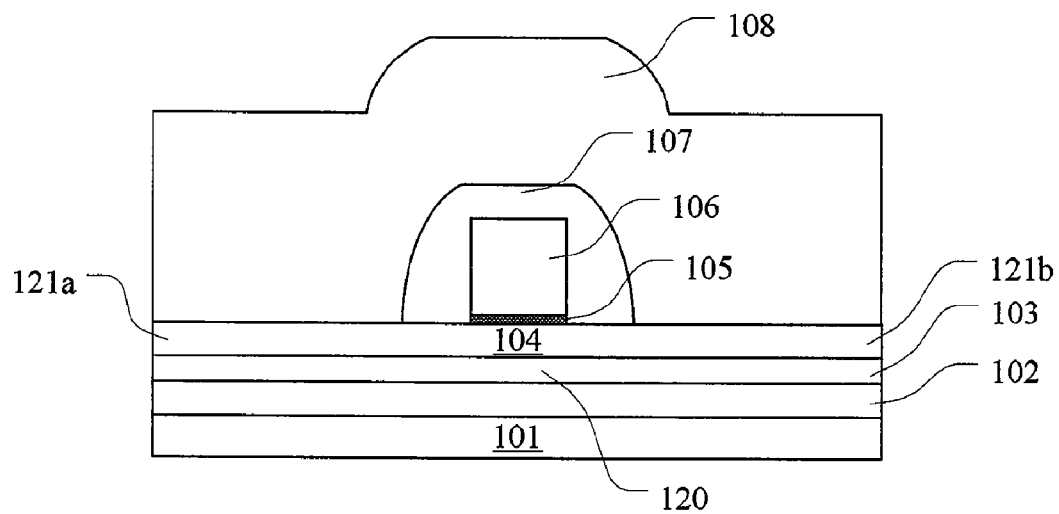

As shown in FIG. 5, an interlayer dielectric layer 108 (for example, $SiO_2$) is formed on the exposed surface of the epitaxial semiconductor layer 104 and on the nitride isolation layer 107 by a conventional deposition process to protect the epitaxial semiconductor layer 104 in the subsequent steps.

Figure 6:
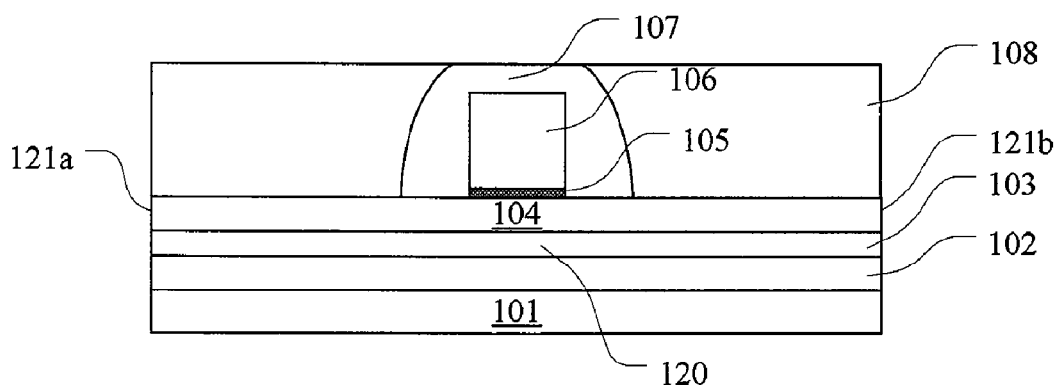

As shown in FIG. 6, a portion of the interlayer dielectric layer 108 is removed by, for example, chemical mechanical planarization (CMP), with the cap of the nitride isolation layer 107 as an etch stopper layer, so as to provide a flat surface of the semiconductor structure.

Figure 7:
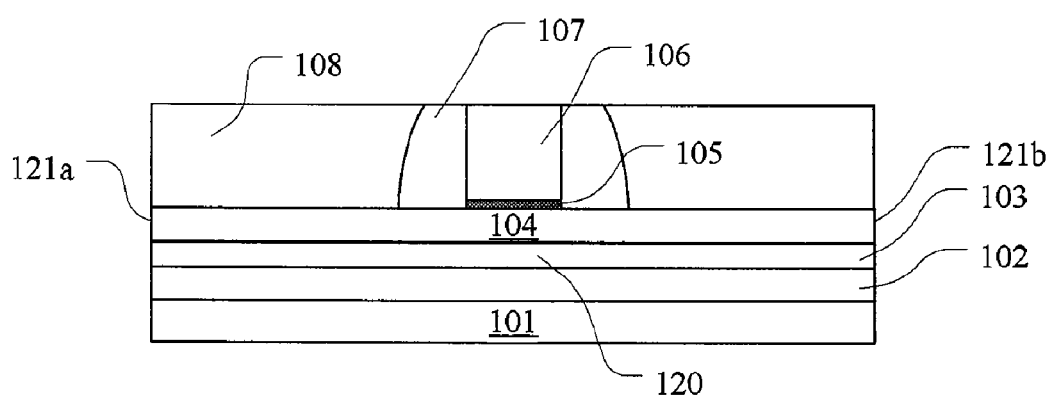

As shown in FIG. 7, the cap of the nitride isolation layer 107 is then removed by, for example, an additional CMP process, to expose the top surface of the gate conductor layer 106. Meanwhile, the portions of the nitride isolation layer 107 on the lateral sides of the gate stack remain and serve as sidewall spacers of the gate.

Alternatively, the cap of the nitride isolation layer 107 may be firstly selectively removed by reactive ion etching (RIE).

Figure 8:
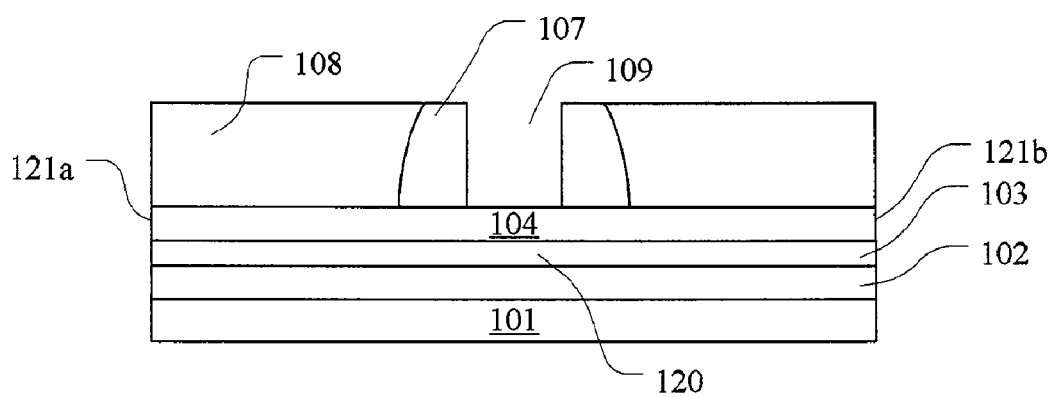

Then, the sacrificial gate is removed by dry etching or selective wet etching to provide a gap 109 which exposes the surface of the epitaxial semiconductor layer 104, as shown in FIG. 8.

Figure 9:
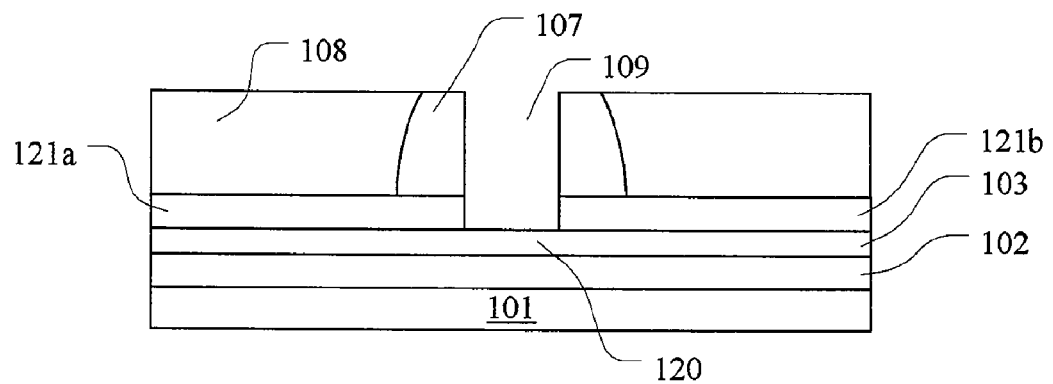

Further, as shown in FIG. 9, the exposed portion of the epitaxial semiconductor layer 104 in the gap 109 is removed by selective wet etching which stops on the top of the top semiconductor layer 103 of the ultra-thin SOI substrate.

Figure 10:
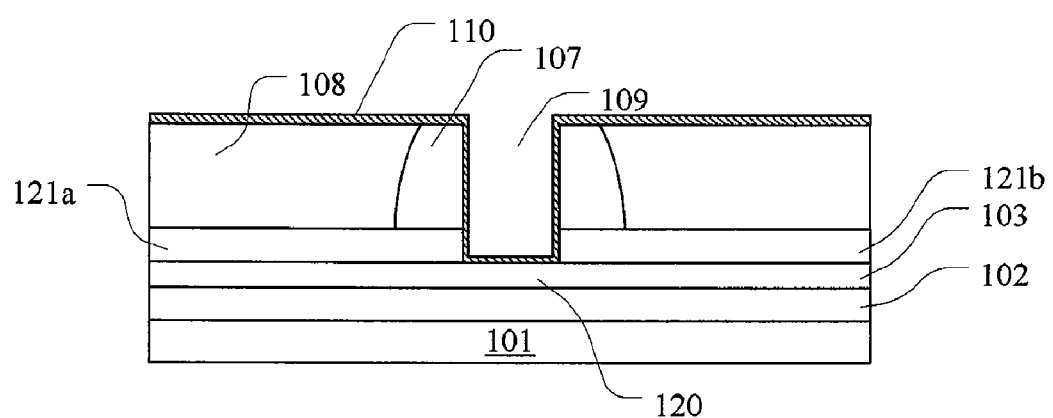

As shown in FIG. 10, a high K dielectric layer 110 (for example, HfO2) is then formed conformally on the whole surface of the semiconductor structure by a conventional deposition process. The high K dielectric layer 110 covers the inner wall of the gap 109 and the exposed surface of the top semiconductor layer 103 of the ultra-thin SOI substrate at the bottom of the gap 109.

Figure 11:
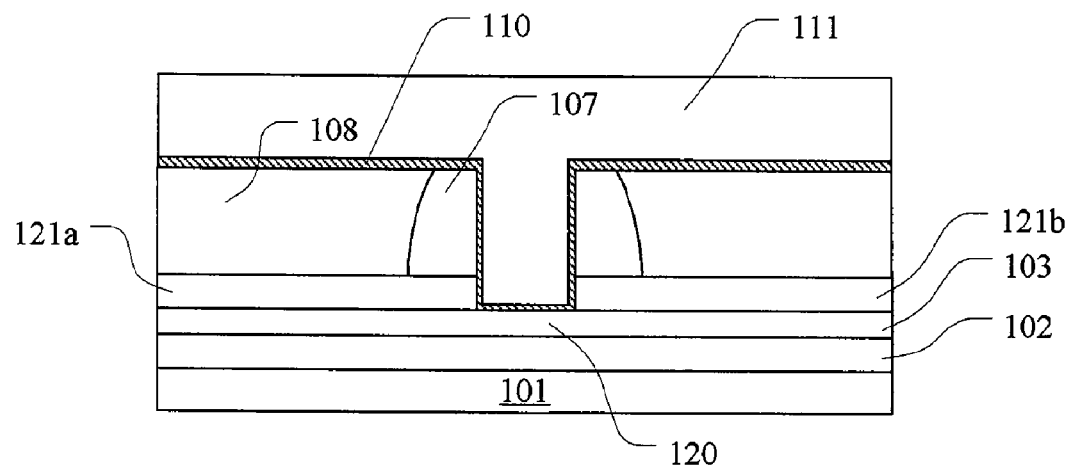
Figure 12:
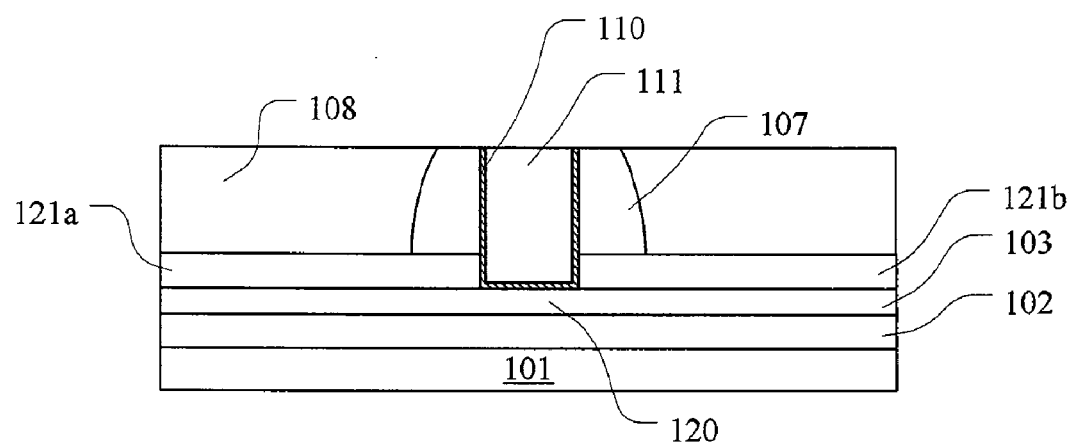

Subsequently, a gate conductor layer 111 (for example, TiN) is then formed on the whole surface of the semiconductor structure by a conventional deposition process. The gate conductor layer 111 fills the gap 109 and covers the surface of the high K dielectric layer 110 outside the gap 109, as shown in FIG. 11. Here, the gate conductor layer 111 comprises one or more layers. For example, as required, a TiN layer may be firstly deposited, and then a TiAlN layer may be deposited.

The portions of the gate dielectric layer 110 and the gate conductor layer 111 outside the gap 109 may be removed, for example, by CMP. The portions of the conformal gate dielectric layer 110 and the gate conductor layer 111 filled in the gap 109 remain and serve as the gate (also referred to as "replacement gate") of the final transistor.

Figure 13:
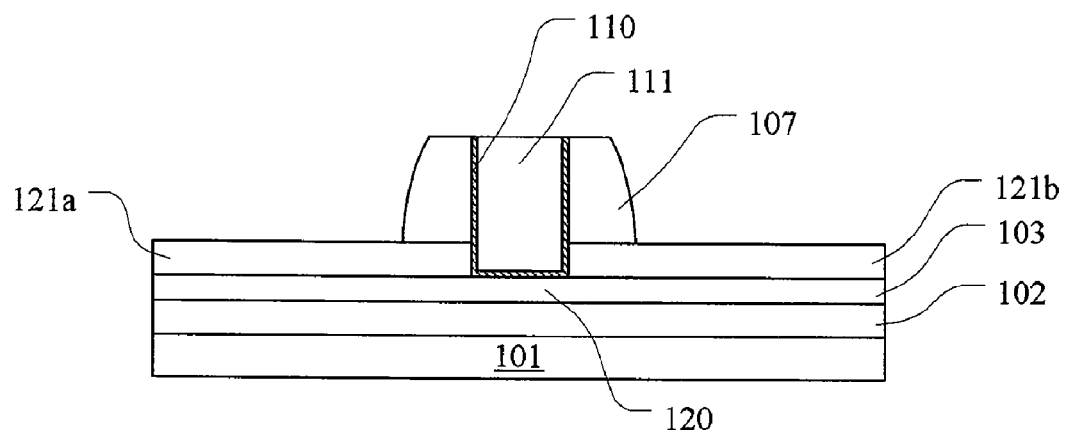

Optionally, as shown in FIG. 13, the interlayer dielectric layer 108 is completely removed by, for example, selective wet etching, so as to expose the surface of the epitaxial semiconductor layer 104 to perform the subsequent silicidation steps.

Next, metal silicides are formed in the exposed surfaces of source/drain regions 121a, 121b by a conventional MOS process, and then the unreacted metal is removed, so as to form source/drain contact regions 122a, 122b.

One skilled person in the art will appreciate that the step of removing the interlayer dielectric layer 108 may not be performed. In the subsequent steps, as required, the interlayer dielectric layer 108 may be opened directly to have contact holes. As aforementioned, metal silicides may be formed in the contact holes and the unreacted metal may be removed therefrom.

The resultant transistor is shown in FIG. 14. A channel region 120 is formed in the top semiconductor layer of an ultra-thin SOI substrate, and source/drain regions 121a, 121b are formed in an epitaxial semiconductor layer on the top semiconductor layer. A gate dielectric layer 110 and a gate conductor layer 111 are formed above the channel region 120. The gate conductor layer 111 is isolated from the channel region 120 and the source/drain regions 121a, 121b by the gate dielectric layer 110.

Since the epitaxial semiconductor layer 104 is located above the top semiconductor layer 103 of the SOI substrate, the source/drain regions 121a, 121b are "raised" with respect to the channel region 120. Thus, the source/drain regions 121a, 121b provide RSDs of an ultra-thin SOI transistor.

Since the source/drain regions 121a, 121b extend below the sidewall spacers 107 and abut the channel region 120, the resultant transistor has a reduced ON-state resistance and reduced power consumption.

While the invention has been described with reference to specific embodiments, the description is illustrative of the invention. The description is not intended to enumerate all the embodiments or limit the invention. Thus, the present invention is not limited to the described embodiments. Various modifications and applications may occur for those skilled in the art without departing from the true spirit and scope of the invention as defined by the appended claims.

What is claimed is:

1. A method for manufacturing a semiconductor structure, comprising:
   a) forming an epitaxial semiconductor layer on a semiconductor substrate;
   b) forming a sacrificial gate on the epitaxial semiconductor layer;
   c) forming a sidewall spacer surrounding the sacrificial gate;
   d) implanting ions into the epitaxial semiconductor layer using the sacrificial gate as a hard mask, so as to form source/drain regions;
   e) removing the sacrificial gate to form a gate gap, so as to expose a surface of the epitaxial semiconductor layer, while remaining the sidewall spacer;
   f) removing the portion of the epitaxial semiconductor layer that is exposed from the gate gap to expose a surface of the semiconductor substrate;
   g) forming a conformal gate dielectric layer in the gate gap; and
   h) forming a gate conductor layer in the gate gap, wherein the gate conductor is surrounded by the sidewall spacer, and wherein the sidewall spacer is used with the sacrificial gate for aligning the source/drain regions, is used for removing the sacrificial gate, is used for defining the gate gap, and is used for forming the gate conductor layer.

2. The method according to claim 1, wherein step b) comprises: forming a stack including a gate dielectric layer and a gate conductor layer for the sacrificial gate, and then patterning the stack.

3. The method according to claim 1, wherein step c) comprises: forming a nitride isolation layer on the sidewalk and/or the top of the sacrificial gate.

4. The method according to claim 3, further comprising: after the formation of the nitride isolation layer, performing a planarization process using the nitride isolation layer as a stopper layer, and performing an additional planarization process or reactive ion etching to remove the portion of the nitride isolation layer on the top of the sacrificial gate.

5. The method according to claim 1, wherein step c) comprises: forming an interlayer dielectric layer to protect the epitaxial semiconductor layer.

6. The method according to claim 1, after step h), further comprising: forming metal silicides on the exposed portions of the source/drain regions, so as to form source/drain contact regions.

* * * * *